United States Patent [19]
Huang et al.

[11] Patent Number: 6,159,779
[45] Date of Patent: Dec. 12, 2000

[54] MULTI-LAYER GATE FOR TFT AND METHOD OF FABRICATION

[75] Inventors: Tinghui Huang, Hsinchu; Jeng-Hung Sun, Tainan, both of Taiwan

[73] Assignee: Industrial Technology Research Institute, Hsinchu, Taiwan

[21] Appl. No.: 09/243,155

[22] Filed: Feb. 3, 1999

[51] Int. Cl.$^7$ .................................................. H01L 21/00
[52] U.S. Cl. ........................... 438/158; 438/149; 438/780
[58] Field of Search .................................... 438/149, 166, 438/780, 758

[56] References Cited

U.S. PATENT DOCUMENTS 5,946,551  8/1999  Dimitrakopoulos et al. .

OTHER PUBLICATIONS

H.Sirringhaus et al., Self–Passivated Copper Gates for A–SI TFTs, (IEEE), pp. 388–390, 1997.

*Primary Examiner*—Charles Bowers
*Assistant Examiner*—Scott J. Hawranek
*Attorney, Agent, or Firm*—Tung & Associates

[57] ABSTRACT

A method for fabricating a thin film transistor that has a multi-layered gate structure of large thickness and the transistors formed are disclosed. In the method, an organic polymeric material layer is spin-coated to planarize a metal gate that has a second metal material deposited in a thin layer on the gate. A suitable metal coating material is molybdenum. A novel planarization process by dry etching is then carried out utilizing a UV spectrum of Mo in an end point detection method to remove all the organic polymeric material from a top planar surface of the metal gate (and the metal coating layer) and then stopping the dry etching process. A dielectric material layer such as silicon nitride is then deposited on top of the metal gate and the remaining organic polymeric material layer to complete the isolation process for the gate. The present invention novel method of utilizing an additional metal coating layer on the metal gate therefore allows an easy identification of the end point in the planarization process wherein an organic polymeric material layer provides a base for depositing a dielectric material thereon for insulating the metal gate. Problems normally associated with the conventional method of insulating a thick metal gate, such as step coverage and void formation problems are thus eliminated in the present invention method.

30 Claims, 3 Drawing Sheets

MULTI-LAYER GATE FOR TFT AND METHOD OF FABRICATION

FIELD OF THE INVENTION

The present invention generally relates to a thin film transistor (TFT) for use as a switching device in a liquid crystal display (LCD) and a method for fabrication and more particularly, relates to a TFT that is constructed with a multi-layer gate such that during the fabrication process, the top layer provides a reliable end point detection in the planarization of a polymeric material layer that the gate is embedded to ensure that no polymeric material is left on the top surface of the gate and a method for fabricating such TFT.

BACKGROUND OF THE INVENTION

In recent years, large liquid crystal cells have been used in flat panel displays. The liquid crystal cells are normally constructed by two glass plates joined together with a layer of a liquid crystal material sandwiched inbetween. The glass substrates have conductive films coated thereon with at least one of the substrates being transparent. The substrates are connected to a source of power to change the orientation of the liquid crystal material. A possible source of power is a thin film transistor that is used to separately address areas of the liquid crystal cells at very fast rates. The TFT driven liquid crystal cells can be advantageously used in active matrix displays such as for television and computer monitors.

As the requirements for resolution of liquid crystal monitors increase, it becomes desirable to address a large number of separate areas of a liquid crystal cell, called pixels. For instance, in a modem display panel, more than 3,000,000 pixels may be present. At least the same number of transistors must therefore be formed on the glass plates so that each pixel can be separately addressed and left in the switched state while other pixels are addressed.

Thin film transistors are frequently made with either a polysilicon material or an amorphous silicon material. For TFT structures that are made of amorphous silicon material, a common structure is the inverted staggered type which can be back channel etched or tri-layered. The performance of a TFT and its manufacturing yield or throughput depend on the structure of the transistor. For instance, the inverted staggered back channel etched TFT can be fabricated with a minimum number of six masks, whereas other types of inverted staggered TFT require a minimum number of nine masks. The specification for a typical inverted staggered back channel etched TFT includes an amorphous silicon that has a thickness of 3,000 Å, a gate insulator of silicon nitride or silicon oxide, a gate line of Mo/Ta, a signal line of Al/Mo and a storage capacitor. The requirement of a thick amorphous silicon layer in the TFT device is a drawback for achieving a high yield fabrication process since deposition of amorphous silicon is a slow process. A major benefit for the amorphous silicon TFT is its low leakage current which enables a pixel to maintain its voltage. On the other hand, an amorphous silicon TFT has the drawback of a low charge current (or on current) which requires an excessive amount of time for a pixel to be charged to its required voltage.

A second type of TFT is made by using a polysilicon material. Polysilicon is more frequently used for displays that are designed in a smaller size, for instance, up to three inch diagonal for a projection device. At such a small size, it is economical to fabricate the display device on a quartz substrate. Unfortunately, large area display devices cannot be normally made on quartz substrates. The desirable high performance of polysilicon can therefore be realized only if a low temperature process can be developed to enable the use of non-quartz substrates. For instance, in a more recently developed process, large area polysilicon TFT can be manufactured at processing temperatures of less than 600° C. In the process self-aligned transistors are made by depositing polysilicon and gate oxide followed by source/drain regions which are self-aligned to the gate electrode. The device is then completed with a thick oxide layer, an ITO layer and aluminum contacts.

Polysilicon TFTs have the advantage of a high charge current (or current) and the drawback of a high leakage current. It is difficult to maintain the voltage in a pixel until the next charge in a polysilicon TFT due to its high leakage current. Polysilicon also allows the formation of CMOS devices, which cannot be formed by amorphous silicon. For the fabrication of larger displays, a higher mobility may be achieved by reducing the trap density around the grain boundaries in a hydrogenation process.

FIG. 1 shows an enlarged, cross-sectional view of a conventional amorphous silicon TFT structure. Amorphous TFT 10 is built on a low cost glass substrate 12. On top of the glass substrate 12, a gate electrode 14 is first deposited of a refractory metal such as Cr, Al or Al alloy and then formed. A gate insulating layer 16 is normally formed in an oxidation process. For instance, a high density $TaO_x$ on a Ta gate can be formed to reduce defects such as pin holes and to improve yield. Another gate insulating layer 20 is then deposited of either silicon oxide or silicon nitride. An intrinsic amorphous silicon layer 22 is then deposited with a $n^+$ doped amorphous silicon layer deposited on top to improve its conductivity. Prior to the deposition of the doped amorphous silicon layer 24, an etch stop 26 is first deposited and formed to avoid damages to the amorphous silicon layer 22 in a subsequent etch process for a contact hole. The doped amorphous silicon layer is formed by first depositing the amorphous silicon layer in a chemical vapor deposition process and then implanting ions in an ion implantation process. Boron ions are normally used to achieve $n^+$ polarity. A drain region 30 and a source region 32 are then deposited and formed with a pixel electrode layer 34 of ITO (indium-tin-oxide) material deposited and formed on top. The drain region and the source region 32 are normally deposited of a conductive metal layer. A suitable conductive metal may be a bilayer of Cr/Al. The structure is then passivated with a passivation layer 36.

A second conventional inverted staggered type TFT 40 is shown in FIG. 2. The TFT 40 is frequently called the back channel etched type inverted staggered TFT. A gate electrode 42 is first formed on a non-conducting glass substrate 38. The gate electrode 42 is connected to a gate line (not shown) laid out in the row direction. A dielectric material layer 44 of either silicon oxide or silicon nitride is used to insulate the gate electrode 42. After an amorphous silicon layer 46 and a contact layer 48 are sequentially deposited, patterned and etched, source electrode 50 and drain electrode 52 are formed to provide a channel 54 in-between the two electrodes, hence the name back channel etched TFT. The source electrode 50 of each TFT is connected to a transparent pixel electrode 56 independently formed in the area surrounded by the gate lines and the drain lines (not shown). A transparent passivation layer 58 of a material such as silicon nitride is deposited on the completed structure.

As shown in FIG. 2, the gate electrode 42 is frequently formed of chromium or other similar metals on the transparent glass substrate 38. The dielectric layer 44 of gate oxide or silicon nitride is formed to insulate the upper surface of the glass substrate 38 including the top surface of the gate electrode 42. A semi-conducting layer 46, which may be formed of amorphous silicon is stacked on the dielectric film 44 over the gate electrode 42. The drain electrode 52 and the source electrode 50 are formed on the semi-conducting film 46 and are separated from each other by a predetermined distance forming the channel section 54. The two electrodes each has a contact layer of 48 and a metal layer which are electrically connected to the semi-conducting layer 46. The transparent electrode 44 may be formed of ITO.

In modem TFT-LCD devices, it is desirable to have gate lines, or buslines that have lower electrical resistance so that the performance of the device can be improved. Various techniques have been used in the industry to achieve such purpose. One of the techniques is the use of a copper gate line for its lower electrical resistance. However, the fabrication process for a copper line is more difficult than for other metals that are usually used for the gate lines, i.e., aluminum. Another attempt to improving the gate line resistance is to make the lines wider. However, when the gate lines are designed with a larger width, more space is taken on the transparent substrate to reduce its light transparency which affects the total performance of the LCD. The approach of using a wider line is therefore not feasible. Still others have attempted to make the buslines thicker such that its resistance can be reduced. A thicker busline, even though does not occupy more substrate space in forming, is difficult to insulate by a dielectric layer which is subsequently deposited on top. Problems in step coverage and void formation occur when a silicon nitride layer is deposited over the top of a thick gate line. The insulation of a thick gate line, i.e., thicker than 3,000 Å, therefore requires a new process which is not available in the present fabrication technology.

It is therefore an object of the present invention to provide a method for fabricating a TFT that has a multi-layer gate structure of large thickness that does not have the drawbacks or shortcomings of the conventional methods.

It is another object of the present invention to provide a method for fabricating a TFT that has a multi-layer gate structure of large thickness that can be effectively insulated by the deposition of more than one insulating layers.

It is a further object of the present invention to provide a method for fabricating a TFT that has a multi-layer gate structure of large thickness by insulating the gate structure with an insulative polymeric material layer in combination with a nitride dielectric layer.

It is another further object of the present invention to provide a method for fabricating a TFT that has a multi-layer gate structure of large thickness by coating the gate structure with a second metal layer on top which can be used for end point detection in a planarization process for the gate structure.

It is still another object of the present invention to provide a method for fabricating a TFT that has a multi-layer gate structure of large thickness wherein the gate structure has a thickness larger than 4,000 Å.

It is yet another object of the present invention to provide a method for fabricating a TFT that has a multi-layer gate structure of large thickness wherein the gate structure has a thickness between about 4,000 Å and about 8,000 Å.

It is still another further object of the present invention to provide a method for fabricating a TFT that has a multi-layer gate structure of large thickness wherein a metal gate is coated with a Mo layer before the deposition of an insulating polymeric layer.

It is yet another further object of the present invention to provide a method for fabricating a TFT that has a multi-layer gate structure of large thickness wherein a dry etching method is used incorporating an end point detection technique for planarizing an insulating polymeric material layer that embedded the gate structure.

SUMMARY OF THE INVENTION

In accordance with the present invention, a method for fabricating a TFT device which has a multi-layer gate structure of large thickness and the device fabricated are disclosed.

In a preferred embodiment, a method for fabricating a TFT that has a multi-layer gate structure can be carried out by the operating steps of first providing a non-electrical conductive substrate, forming a metal gate on the substrate, depositing and patterning a second metal layer overlying the metal gate, depositing an insulative polymeric material layer embedding the metal gate and the second metal layer, planarizing the insulative polymeric material layer until the second metal layer on a horizontal surface of the metal gate is completely exposed, and sequentially depositing a dielectric material layer, and intrinsic amorphous silicon layer, a $n^+$ doped amorphous silicon layer and a third metal layer on top and forming a back channel exposing the $n^+$ doped amorphous silicon.

The method for fabricating a TFT that has a multi-layer gate structure of large thickness may further include the step of depositing and forming an etch stop layer between the intrinsic amorphous silicon layer and the $n^+$ doped amorphous silicon layer and forming a channel to expose the etch stop layer. The etch stop layer may be formed of silicon nitride. The second metal layer may be deposited of a metal selected from the group consisting of Mo, Cr, Ta and Ti. The method may further include the step of terminating the planarization step by an end point detection method when the second metal layer on top of a horizontal surface of the metal gate is completely exposed.

In the method, the third metal layer may be deposited of at least one metal selected from the group consisting of Mo, Cr and Al. The third metal layer may further be deposited of bi-layers of different metals. The dielectric material layer deposited on top of the second metal layer and the insulative polymeric material layer may be silicon nitride. The method may further include the step of forming the metal gate to a thickness of at least 4,000 Å for improved resistivity, or forming the metal gate to a thickness of between about 4,000 Å and about 10,000 Å, and preferably between about 6,000 Å and about 8,000 Å. The TFT formed may be a back channel-etched inverted staggered TFT, or a tri-layered inverted staggered TFT.

The method may further include the step of planarizing the insulative polymeric material layer by a reactive ion etching technique utilizing $O_2$ and $SF_6$ gases. The method may further include the step of patterning the second metal layer such that the entire metal gate is covered, the step of depositing the insulative polymeric material layer by a spin coating technique, and the step of forming a metal gate on the substrate as a busline for a TFT-LCD.

The present invention is further directed to a method for fabricating a TFT that has a multi-layer gate structure of large thickness by the operating steps of first providing a glass substrate that is substantially transparent, forming a metal gate on the substrate, depositing and patterning a Mo layer overlaying the metal gate, depositing an insulative polymeric material layer embedding the metal gate and the Mo layer, dry etching the insulative polymeric material layer and terminating the etching by an end point detection method when the Mo layer on a horizontal surface of the metal gate is completely exposed, and sequentially depositing a dielectric material layer, an intrinsic amorphous silicon layer, a n+ doped amorphous silicon layer and a third metal layer on top and forming a back channel exposing the n+ doped amorphous silicon.

The method for fabricating a TFT may further include the step of depositing and forming an etch-stop layer between the intrinsic amorphous silicon layer and the n+ doped amorphous silicon layer and forming a channel to expose the etch stop layer. The etch stop layer may be formed of silicon nitride. The third metal layer may be deposited of at least one metal selected from the group consisting of Mo, Cr and Al. The third metal layer may also be deposited of bi-layers of different metals. The dielectric material layer deposited on top of the Mo layer and the insulative polymeric material layer is silicon nitride. The method may further include the step of forming the metal gate to a thickness of between about 4,000 Å and about 10,000 Å, and preferably between about 6,000 Å and about 8,000 Å.

The method may further include the step of dry etching the insulative polymer material layer by a reactive ion etching technique utilizing etchant gases of $O_2$ and $SF_6$. The method may further include the step of patterning the Mo layer such that the entire metal gate is covered by Mo. The method may further include the step of depositing the insulative polymeric material layer by a spin coating technique and curing the layer between 250~350° C. for at least ½ hour.

The present invention is further directed to a thin film transistor that has a multi-layer gate of large thickness which includes a glass substrate, a metal gate situated on the substrate having a planar top portion and sloped shoulder portions, a second metal layer substantially overlying the gate, an insulative polymeric material layer covering the substrate and the shoulder portions of the gate and is absent on the planar top portion of the gate, a dielectric layer embedding the planar top portion of the gate and the insulative polymeric material layer, and at least one amorphous silicon layer and a metal source/drain layer on top of the dielectric layer.

The TFT may further include a second metal layer which is formed of a metal selected from Mo, Cr, Ta and Ti. The metal gate may have a thickness between about 4,000 Å and about 10,000 Å. The dielectric layer may be formed of silicon nitride. The at least one amorphous silicon layer includes an intrinsic amorphous silicon layer and an n+ doped amorphous silicon layer. The TFT may further include an etch-stop layer of a dielectric material situated between the at least one amorphous silicon layers.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for fabricating a TFT that has a multi-layered gate structure of large thickness which cannot be produced by conventional methods and TFT devices fabricated by such method.

The present invention novel method enables the fabrication of multi-layered gate structures in TFTs such that a larger thickness metal gate can be formed to reduce the electrical resistance of the gate and to improve the operating efficiency of the TFT. The problems observed in preparing conventional TFTs with large thickness metal gates such as that observed in covering the metal gate by a subsequently deposited silicon nitride layer resulting in poor step coverage and void formation are eliminated.

The present invention discloses a method in which a first layer gate busline may be formed and patterned by using pure metals or metal alloys. A second layer of metal such as Mo is then deposited on the metal gate in a thin layer conforming to the metal gate busline pattern. The first layer metal gate busline may be formed of Al and protected by anodic aluminum oxide. A planarization layer can then be formed on top of the metal gate and the second metal layer by using an organic polymeric material in a spin-coating process. The organic polymeric layer is then dry etched utilizing reactive gas plasma of $O_2$ mixed with $SF_6$. An end point detection method utilizing UV spectrum of Mo is used to detect the organic polymeric layer etching end point. After the etching process for planarization is completed, the top surface of the gate busline is exposed from the planarization layer. The characteristics of the present invention TFT are therefore not affected by any residual organic polymeric material left on the metal gate busline.

Figure 3A:
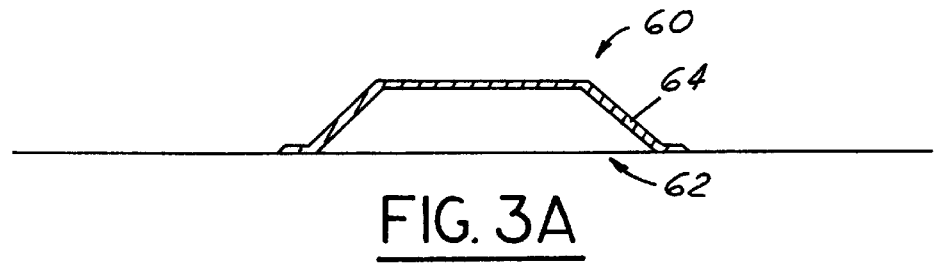
FIG. 3A is an enlarged, cross-sectional view of the present invention TFT showing a metal gate and a formed metal coating on the gate.

Referring now to FIG. 3A, wherein a present invention TFT 60 with only a metal gate 62 and a second metal layer 64 deposited and patterned is shown. The metal gate 62 is formed by first depositing a Metal 1 (M1, not shown) layer with a material such as Cr, Al or their alloys. Aluminum alloys are widely used as the metal gate material for its low electrical resistance. The M1 layer is then patterned to form the metal gate 62. A Metal 2 (M2) layer is then deposited (not shown) on top of the metal gate 62 and patterned. It should be noted that the M2 layer deposited covers a wider area than the metal gate 62. The M2 layer may be deposited of a metal selected from the group of Mo, Cr, Ta, Ti and any other suitable metallic materials.

Figure 3B:
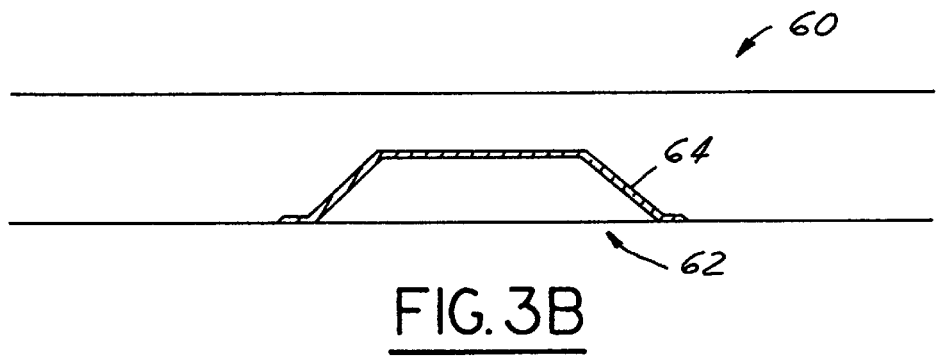
FIG. 3B is an enlarged, cross-sectional view of the present invention TFT of FIG. 3A with an insulative polymeric material layer spin-coated on top.

In the next step of the process, as shown in FIG. 3B, an organic polymeric material layer 68 which is electrically insulative is deposited on top of the metal gate 62 and the second metal layer 64 embedding both layers. The coating process utilized for the organic polymeric layer may be a spin coating method conducted at between 1200 RPM and 1500 RPM at room temperature. After the organic polymeric material layer 68 is spin-coated, it can be cured at a temperature between about 250° C. and about 350° C. for a time period between about ½ hour and about 1.5 hours. A suitable curing time may be 1 hour. The organic polymeric material is coated to planarize the TFT device, and more importantly, to provide a base for the subsequently deposited silicon nitride dielectric layer such that only a nominal thickness of the nitride layer is necessary. The spin coating thickness of the organic polymeric material is not important since the layer is planarized in a subsequent processing step.

Figure 3C:
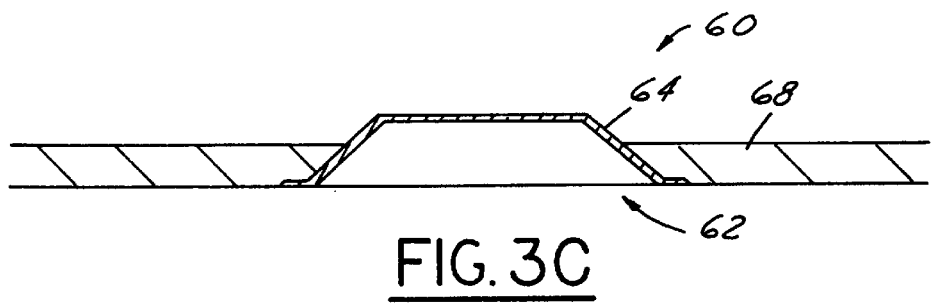
FIG. 3C is an enlarged, cross-sectional view of the present invention TFT of FIG. 3B with the polymeric material layer planarized by a dry etching method using an end point detection technique.

After the planarization process is completed, a structure such as that shown in FIG. 3C is obtained. The planarization process may be carried out by a reactive ion etching (RIE) method. In a RIE process, an etchant gas that is effective in etching a metallic coating layer of Mo may be a mixture of $O_2$ and $SF_6$. It is known that $O_2$ plasma is effective in etching polymeric materials, while $SF_6$ plasma is effective in etching Mo metal. The Mo metal is selected as the second metal material for use on the gate busline since the presence of Mo can be easily identified by a UV spectrum in an end point detection method. The method will be described in detail later in FIGS. 6A and 6B.

During the dry etching process, when the Mo layer is reached, a pronounced upswing in the UV spectrum is shown in the end point detection method. Any further etching of the organic polymer can then be precisely controlled by controlling the over-etching time that passed the end point for Mo. The present invention novel method therefore prevents any residual organic polymeric material from being left on a top planar surface of the metal gate 62. The dry etching process is normally continued until a shoulder portion of the second metal layer, i.e., of Mo, is shown to ensure that no residual polymer is left on the top planar surface of the metal gate 62.

It should be noted that the etching chemistry of $O_2$ and $SF_6$ is selected for the etching of the organic polymeric layer and the Mo metal. When other metal is used as the second metal layer 64, a different etch chemistry may be necessary for catching the end point of the planarization process.

Figure 3D:
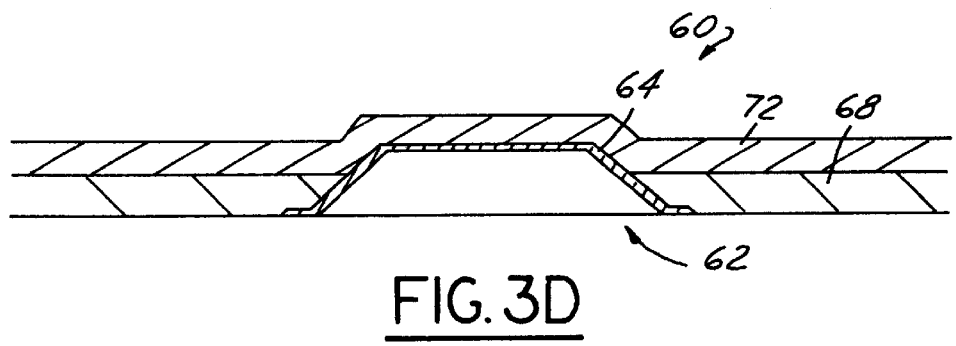
FIG. 3D is an enlarged, cross-sectional view of the present invention TFT of FIG. 3C with a dielectric layer deposited on top.

The present invention novel method therefore first deposits a Mo layer on a metal gate, and then planarizes the structure in a dry etching method in which gas plasma of $O_2$ and $SF_6$ is used to easily catch an end point of etching by following a UV spectrum of Mo. The present invention novel process therefore ensures that when the planarization process is completed, there is no residual organic polymer layer left on the top planar surface of the metal gate. This avoids the problem of having an insulating material that contaminates the gate surface resulting in a loss in performance for the busline and for the TFT-LCD. In the next step of the process, as shown in FIG. 3D, a dielectric material layer 72, such as silicon nitride, is blanket deposited on top of the organic polymer layer 68 and the metal coating layer 64. It is noted that the contour of the metal gate 62 is duplicated by the dielectric coating layer 72. The present invention novel method and the benefits achieved by the method are therefore self-evident by an examination of FIG. 3D. It is seen that when a metal gate 62 of larger thickness, i.e., thicker than 4,000 Å, is insulated by a dielectric layer, the dielectric layer 72 does not require a large thickness since the organic polymeric layer 68 provides a base onto which the dielectric layer can be deposited. Problems occurred in the conventional TFT device when a thick metal gate is used, i.e., step coverage and void formation problems, are therefore completely eliminated in the present invention novel method.

Figure 3E:
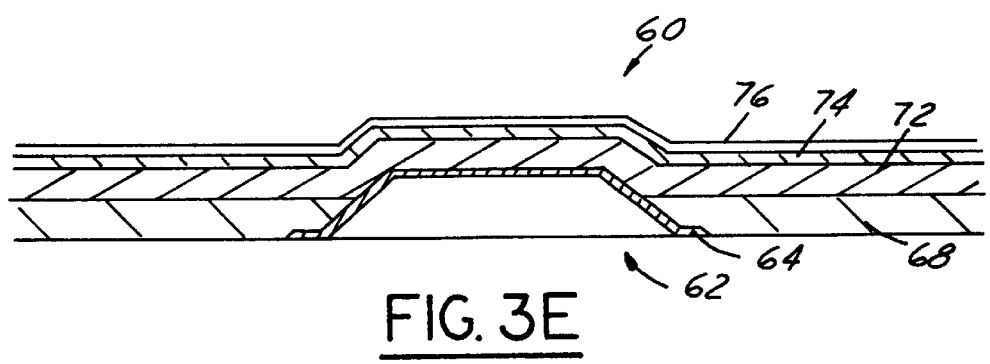
FIG. 3E is an enlarged, cross-sectional view of the present invention TFT of FIG. 3D with additional layers of amorphous silicon deposited on top.

After the deposition of the dielectric layer, i.e., the silicon nitride layer 72., is completed, additional amorphous silicon layers of both the intrinsic type 74 and the $n^+$ doped type 76 are sequentially deposited on top of the dielectric layer 72. It is seen in FIG. 3E that the contour of the metal gate 62 is duplicated by the amorphous silicon layers 74 and 76.

Figure 1:
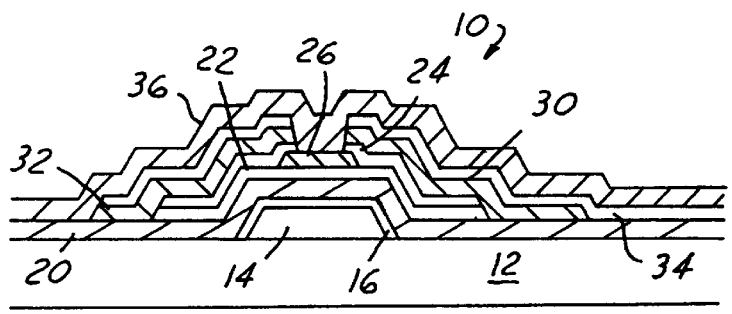
FIG. 1 is an larged, cross-sectional view of a conventional inverted staggered TFT of the tri-layered type.
Figure 2:
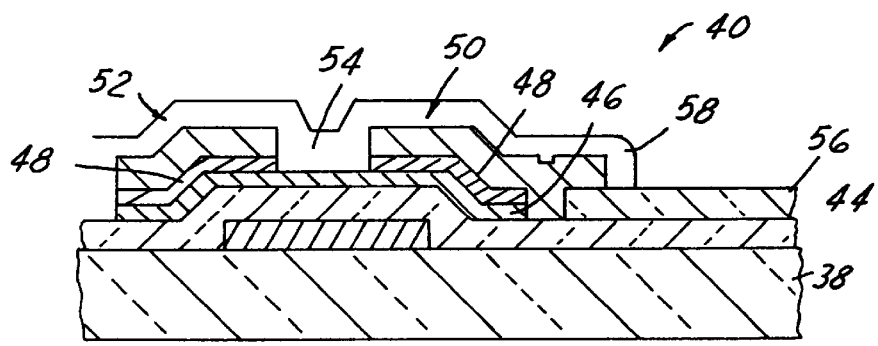
FIG. 2 is an enlarged, cross-sectional view of a conventional inverted staggered TFT of the back channel-etched type.
Figure 4:
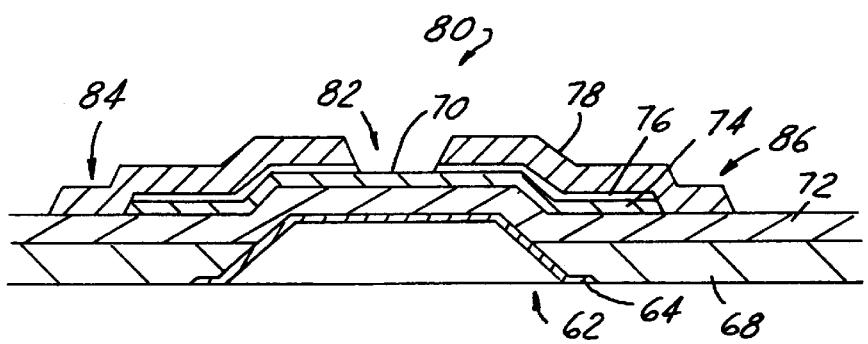
FIG. 4 is an enlarged, cross-sectional view of the present invention TFT of the back channel etched type.

The intrinsic amorphous silicon layer 74 and the $n^+$ doped amorphous silicon layer 76, together with the silicon nitride layer 72 are then masked in a photolithographic process and etched to form an amorphous silicon island 70. This is shown in FIG. 4 in a back channel etched TFT structure 80. Metal layer 78 is then deposited and subsequently patterned to form a back channel 82, a source electrode 84 and a drain electrode 86. A present invention novel structure of a back channel etched inverted staggered TFT 80 is thus completed. A final passivation layer of a dielectric material (not shown) such as silicon nitride may be deposited on top and then formed. It should be noted that an ITO electrode layer may be used in the TFT which is not shown in FIG. 4 for simplicity reasons.

Figure 5:
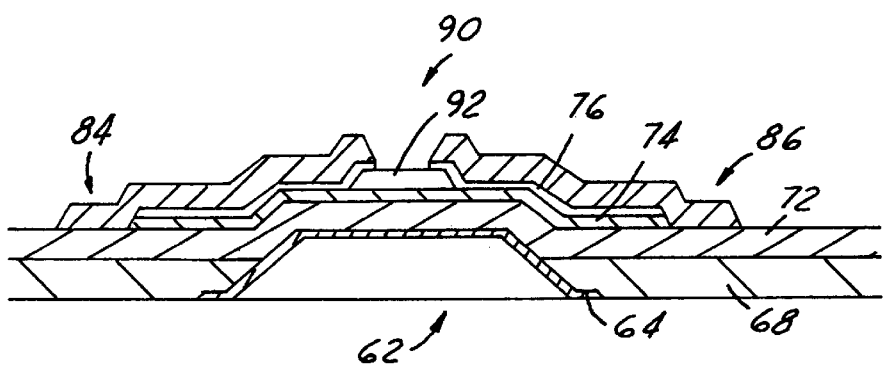
FIG. 5 is an enlarged, cross-sectional view of the present invention TFT of the tri-layered type.

The present invention novel method may further be utilized in forming a tri-layered type TFT 90 such as that shown in FIG. 5. The preparation steps shown in FIGS. 3A–3E are similarly used for preparing the tri-layered inverted staggered TFT 90. The major difference between the tri-layered TFT 90 and the back channel-etched TFT 80 shown in FIG. 4 is the additional step of depositing and forming an etch stop 92 situated between the intrinsic amorphous silicon layer 74 and the $n^+$ doped amorphous silicon layer 76. As shown in FIG. 5, the tri-layered inverted staggered TFT 90 can be formed by the present invention novel method of first planarizing an organic polymeric material layer 62 and then depositing a thin silicon nitride layer 72 on top for insulating the metal gate 62. The same desirable result of the present invention is therefore achieved in the tri-layered type TFT 90. The tri-layered TFT 90 shown in FIG. 5 may further be protected by a passivation layer (not shown) of dielectric material such as silicon nitride.

Figure 6:
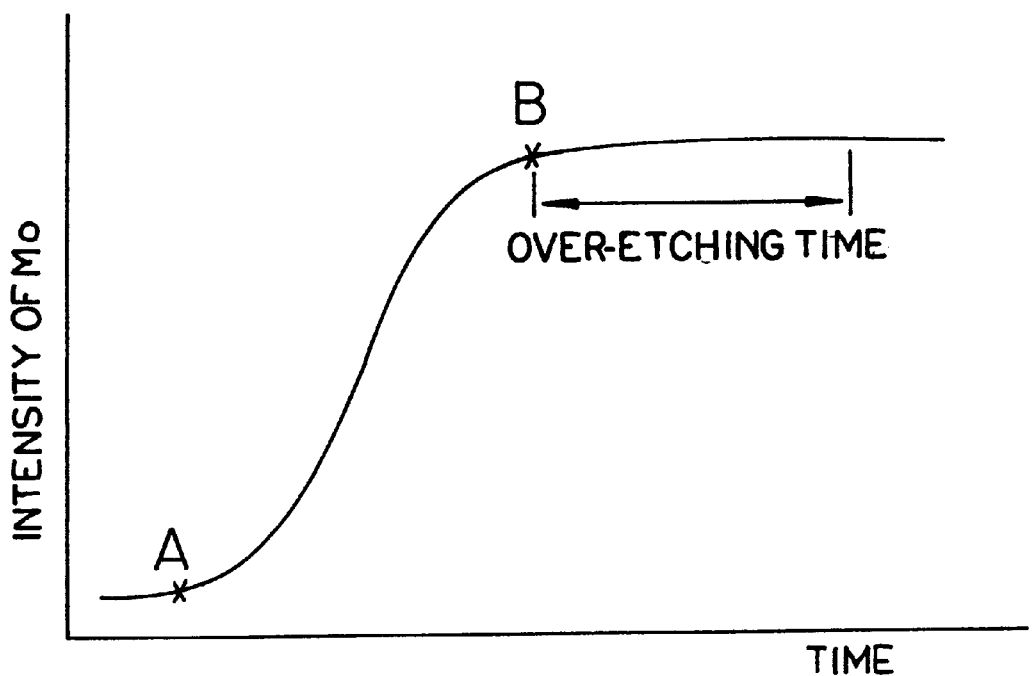
FIG. 6 is a is a graph illustrating the end point detection method for Mo utilized in the present invention method for forming TFT with multi-layered metal gate.
Figure 6A:
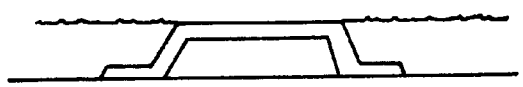
FIG. 6A is an enlarged, cross-sectional view of the present invention TFT representing the starting point when Mo is exposed.
Figure 6B:
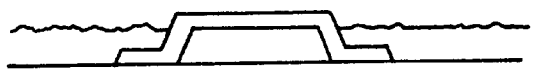
FIG. 6B is an enlarged, cross-sectional view of the present invention TFT representing the end point when all the planar Mo is exposed.

The present invention novel method for planarization by using a UV spectrum of Mo for end point detection is shown in detail in FIGS. 6, 6A and 6B. FIG. 6 shows the UV spectrum of Mo which represents that, at point A, the structure shown in 6A is achieved by the dry etching process with the top planar surface of the metal gate 62 beginning to expose, i.e., starting to detect the presence of Mo. The presence of Mo gradually increases along the spectrum until point B is reached which indicates that the top planar surface of the metal gate 62 covered by the Mo layer 64 is completely exposed. This is represented by the structure shown in FIG. 6B. To practice the present invention novel method, a suitable over-etching time is first selected, as indicated in the TV spectrum of FIG. 6, by an empirical method such that a suitable thickness of the organic polymeric material is left on the surface of the glass substrate. The over-etching time is also dependent on the etch rate of the etchant gas utilized.

The present invention novel method therefore utilizes a thickness of an organic polymeric material as a base for building the total height required for insulating the metal gate 62 by a dielectric material. The method permits the use of a thick metal gate, while not incurring any planarization problem that would otherwise occur when a silicon nitride layer is used. For instance, instead of forming a normal thickness of 3,000 Å for a metal gate, the present invention method allows the formation of metal gates that are thicker than 3,000 Å, i.e., in the range between about 4,000 Å and about 10,000 Å, and preferably in the range between about 6,000 Å and about 8,000 Å. The organic polymeric material layer is normally planarized, or dry etched, to half of its original coated thickness. The original coated thickness may be in the range of approximately 10,000 Å.

The present invention novel method and structures formed by the method have therefore been amply demonstrated in the above descriptions and in the appended drawing of FIGS. 3A–6B. It should be noted that while Mo has been illustrated as a metal coating layer on top of the metal gate and the dry etching by $O_2$ and $SF_6$ gas plasma have been illustrated, any other suitable metal for coating the gate and any other etchant gas chemistry may be selected for achieving the same desirable result.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. A method for fabricating a thin film transistor (TFT) having a multi-layer gate structure comprising the steps of:
   providing a non-electrical-conductive substrate,
   forming a metal gate on said substrate,
   depositing and patterning a second metal layer overlying said metal gate,
   depositing an insulative polymeric material layer embedding said metal gate and said second metal layer,
   planarizing said insulative polymeric material layer until said second metal layer on a top planar surface of said metal gate is completely exposed, and
   sequentially depositing a dielectric material layer, an intrinsic amorphous silicon layer, an n+ doped amorphous silicon layer and a third metal layer on top and forming a back channel exposing said n+ doped amorphous silicon.

2. A method for fabricating a thin film transistor having a multi-layer gate structure according to claim 1 further comprising the step of depositing and forming an etch stop layer between said intrinsic amorphous silicon layer and said n+ doped amorphous silicon layer and forming a channel to expose said etch stop layer.

3. A method for fabricating a thin film transistor having a multi-layer gate structure according to claim 1, wherein said etch stop layer is formed of silicon nitride.

4. A method for fabricating a thin film transistor having a multi-layer gate structure according to claim 1, wherein said second metal layer is deposited of a metal selected from the group consisting of Mo, Cr, Ta and Ti.

5. A method for fabricating a thin film transistor having a multi-layer gate structure according to claim 1, wherein said second metal layer is Mo.

6. A method for fabricating a thin film transistor having a multi-layer gate structure according to claim 1 further comprising the step of terminating said planarizing step by an end point detecting method when said second metal layer on said top planar surface of said metal gate is completely exposed.

7. A method for fabricating a thin film transistor having a multi-layer gate structure according to claim 1, wherein said third metal layer is deposited of at least one metal selected from the group consisting of Mo, Cr and Al.

8. A method for fabricating a thin film transistor having a multi-layer gate structure according to claim 1, wherein said third metal layer is deposited of bi-layers of different metals.

9. A method for fabricating a thin film transistor having a multi-layer gate structure according to claim 1, wherein said dielectric material layer deposited on top of said second metal layer and said insulative polymeric material layer is BCB.

10. A method for fabricating a thin film transistor having a multi-layer gate structure according to claim 1 further comprising the step of forming said metal gate to a thickness of at least 500 Å for improved conductivity.

11. A method for fabricating a thin film transistor having a multi-layer gate structure according to claim 1 further comprising the step of forming said metal gate to a thickness of between about 2,000 Å and about 10,000 Å.

12. A method for fabricating a thin film transistor having a multi-layer gate structure according to claim 1 further comprising the step of forming said metal gate to a thickness of preferably between about 6,000 Å and about 8,000 Å.

13. A method for fabricating a thin film transistor having a multi-layer gate structure according to claim 1, wherein said TFT formed is a back channel etched inverted staggered TFT.

14. A method for fabricating a thin film transistor having a multi-layer gate structure according to claim 2, wherein said TFT formed is a tri-layered inverted staggered TFT.

15. A method for fabricating a thin film transistor having a multi-layer gate structure according to claim 1 further comprising the step of planarizing said insulative polymeric material layer by a reactive ion etching (RIE) technique.

16. A method for fabricating a thin film transistor having a multi-layer gate structure according to claim 1 further comprising the step of planarizing said insulative polymeric material layer by a reactive ion etching technique utilizing $O_2$ and $SF_6$ gases.

17. A method for fabricating a thin film transistor having a multi-layer gate structure according to claim 1 further comprising the step of patterning said second metal layer such that the entire metal gate is covered.

18. A method for fabricating a thin film transistor having a multi-layer gate structure according to claim 1 further comprising the step of depositing said insulative polymeric material layer by a spin-coating technique.

19. A method for fabricating a thin film transistor having a multi-layer gate structure according to claim 1 further comprising the step of forming a metal gate on said substrate as a busline for a TFT LCD.

20. A method for fabricating a thin film transistor (TFT) having a multi-layer gate structure comprising the steps of:
   providing an optically transparent glass substrate,
   forming a metal gate on said substrate, depositing and patterning a Mo layer overlying said metal gate, depositing an insulative polymeric material layer embedding said metal gate and said Mo layer, dry etching said insulative polymeric material layer and terminating said etching by an end point detection method when said Mo layer on a horizontal surface of said metal gate is completed exposed, and sequentially depositing a dielectric material layer, an intrinsic amorphous silicon layer, an n+ doped amorphous silicon layer and a third metal layer on top and forming a back channel exposing said n+ doped amorphous silicon.

21. A method for fabricating a thin film transistor having a multi-layer gate structure according to claim 20 further comprising the steps of:

depositing and forming an etch stop layer between said intrinsic amorphous silicon layer and said n+ doped amorphous silicon layer, and forming a channel to expose said etch stop layer.

22. A method for fabricating a thin film transistor having a multi-layer gate structure according to claim 20, wherein said etch stop layer is formed of silicon nitride.

23. A method for fabricating a thin film transistor having a multi-layer gate structure according to claim 20, wherein said third metal layer is deposited of at least one metal selected from the group consisting of Mo, Cr and Al.

24. A method for fabricating a thin film transistor having a multi-layer gate structure according to claim 20, wherein said third metal layer is deposited of bi-layers of different metals.

25. A method for fabricating a thin film transistor having a multi-layer gate structure according to claim 20, wherein said dielectric material layer deposited on top of said Mo layer and said insulative polymeric material layer is silicon nitride.

26. A method for fabricating a thin film transistor having a multi-layer gate structure according to claim 20 further comprising the step of forming said metal gate to a thickness of between about 2,000 Å and about 10,000 Å.

27. A method for fabricating a thin film transistor having a multi-layer gate structure according to claim 20 further comprising the step of forming said metal gate to a thickness of preferably between about 6,000 Å and about 8,000 Å.

28. A method for fabricating a thin film transistor having a multi-layer gate structure according to claim 20 further comprising the step of dry etching said insulative polymeric material layer by a reactive ion etching technique utilizing etchant gases of $O_2$ and $SF_6$.

29. A method for fabricating a thin film transistor having a multi-layer gate structure according to claim 20 further comprising the step of patterning said Mo layer such that the entire metal gate is covered by Mo.

30. A method for fabricating a thin film transistor having a multi-layer gate structure according to claim 20 further comprising the step of depositing said insulative polymeric material layer by a spin-coating technique and curing said layer between about 250° and about 350° C. for at least ½ hour.

* * * * *